United States Patent
Wang et al.

(10) Patent No.: US 12,068,163 B2
(45) Date of Patent: Aug. 20, 2024

(54) METHOD FOR FORMING SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventors: Hua Wang, Shanghai (CN); Changyong Xiao, Shanghai (CN); Yihui Lin, Shanghai (CN); Qin Zhang, Shanghai (CN); Yi Lu, Shanghai (CN); Xiang Hu, Shanghai (CN); Xiaona Zhu, Shanghai (CN); Ying Jiang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 298 days.

(21) Appl. No.: 17/452,229

(22) Filed: Oct. 25, 2021

(65) Prior Publication Data
US 2022/0130679 A1    Apr. 28, 2022

(30) Foreign Application Priority Data
Oct. 26, 2020 (CN) .......................... 202011158814.X (51) Int. Cl.
| | | |
|---|---|---|
| H01L 21/285 | (2006.01) | |
| H01L 21/02 | (2006.01) | |
| H01L 21/321 | (2006.01) | |
| H01L 21/477 | (2006.01) | |
| H01L 21/8234 | (2006.01) | |

(52) U.S. Cl.
CPC .. H01L 21/28556 (2013.01); H01L 21/02274 (2013.01); H01L 21/28568 (2013.01); H01L 21/3212 (2013.01); H01L 21/477 (2013.01); H01L 21/823431 (2013.01)

(58) Field of Classification Search
None
See application file for complete search history.

(56) References Cited

U.S. PATENT DOCUMENTS 5,527,718 A * 6/1996 Seita .................. H01L 21/28176
257/E21.2
6,140,243 A * 10/2000 Wallace ............ H01L 21/02063
438/720

* cited by examiner

*Primary Examiner* — Alexander G Ghyka
(74) *Attorney, Agent, or Firm* — Anova Law Group, PLLC (57) ABSTRACT

A method for forming a semiconductor structure in provided. The method includes providing a substrate, forming a gate electrode layer on the substrate, and performing a defluorination treatment on the gate electrode layer. The method also includes, after performing the defluorination treatment, forming a barrier layer on a portion of a surface of the gate electrode layer. The barrier layer is made of a material including titanium element.

19 Claims, 4 Drawing Sheets

METHOD FOR FORMING SEMICONDUCTOR STRUCTURE

CROSS-REFERENCE TO RELATED APPLICATION

This application claims priority of Chinese Patent Application No. 202011158814.X, filed on Oct. 26, 2020, the entire content of which is hereby incorporated by reference.

FIELD OF THE DISCLOSURE

The present disclosure generally relates to the field of semiconductor manufacturing technology and, more particularly, relates to a method for forming a semiconductor structure.

BACKGROUND

With development of integrated circuits toward super-large-scale integrated circuits, densities of internal circuits of integrated circuits become higher and higher, numbers of components increase continuously, and sizes of devices shrink continuously.

A manufacturing process of a semiconductor integrated circuit is complicated. To achieve desired functions, electronic components needed for a specific circuit may be required to be fabricated on a small area of a silicon wafer, and appropriate internal wires between the electronic components may be required to be fabricated to form electrical connections. Transistors, as basic semiconductor devices, are widely used in semiconductor structures. A transistor may include a substrate, a gate structure on the substrate, and a source/drain doped region on two sides of the gate structure. To realize electrical connection between a transistor and other semiconductor devices on the substrate, a plurality of conductive structures may be required to be fabricated, for example, conductive plugs or electrical interconnections on a top surface of a gate structure. Performance of the conductive structures may have an important impact on overall performance of the semiconductor structure.

However, performance of a semiconductor structure formed by existing technologies may need to be improved. The disclosed structures and methods are directed to solve one or more problems set forth above and other problems in the art.

BRIEF SUMMARY OF THE DISCLOSURE

One aspect of the present disclosure includes a method for forming a semiconductor structure. The method includes providing a substrate, forming a gate electrode layer on the substrate, and performing a defluorination treatment on the gate electrode layer. The method also includes, after performing the defluorination treatment, forming a barrier layer on a portion of a surface of the gate electrode layer. The barrier layer is made of a material including titanium element.

Optionally, a process of the defluorination treatment includes an annealing process. A gas used in the annealing process includes at least one of hydrogen gas and nitrogen gas. A temperature of the annealing process is in a range approximately from 150° C. to 1100° C.

Optionally, the temperature of the annealing process is in a range approximately from 450° C. to 800° C.

Optionally, time of the annealing process is in a range approximately from 2 hours to 8 hours.

Optionally, the process of the defluorination treatment includes a plasma treatment process. Ions used in the plasma treatment process include at least one of hydrogen ions and boron ions.

Optionally, a temperature of the plasma treatment process is in a range approximately from 35° C. to 65° C.

Optionally, the barrier layer is made of a material including at least one of titanium and titanium nitride.

Optionally, gas pressure of the defluorination treatment is in a range approximately from 1 mTorr to 100 mTorr.

Optionally, the gate electrode layer is made of a material including tungsten. A process of forming the gate electrode material layer includes a chemical vapor deposition process. A gas source used in the chemical vapor deposition process includes tungsten fluoride.

Optionally, after forming the gate electrode layer and before performing the defluorination treatment, the method also includes forming an interlayer dielectric layer on the surface of the gate electrode layer. The interlayer dielectric layer includes a contact opening therein. The contact opening exposes a top surface of the gate electrode layer.

Optionally, after performing the defluorination treatment, the method also includes forming an interlayer dielectric layer on the surface of the gate electrode layer. The interlayer dielectric layer includes a contact opening therein. The contact opening exposes a top surface of the gate electrode layer.

Optionally, a process of forming the barrier layer includes, after performing the defluorination treatment, forming a barrier material film in the contact opening and on a surface of the interlayer dielectric layer, and planarizing the barrier material film until the interlayer dielectric layer is exposed, thereby forming the barrier layer in the contact opening.

Optionally, the method also includes forming a conductive structure in the process of forming the barrier layer. The conductive structure is on a surface of the barrier layer. The conductive structure fills the contact opening.

Optionally, the substrate includes a base and a plurality of fin structures on the base. The gate structure spans a fin structure of the plurality of fin structures.

Optionally, after performing the defluorination treatment and before forming the conductive structure, the method also includes forming a contact layer on a surface of the fin structure on two sides of the gate electrode layer.

Optionally, the contact layer is made of a material including metal silicide.

Optionally, the process of the defluorination treatment also include an annealing process.

Optionally, a process of forming the barrier material film includes a chemical vapor deposition process, a physical vapor deposition process, or an atomic layer deposition process. A process of planarizing the barrier material film includes a chemical mechanical polishing process or an etch-back process.

Optionally, a process of forming the conductive structure includes, after forming the barrier material film, forming a conductive structure material layer on a surface of the barrier material film, and before or when planarizing the barrier material film, planarizing the conductive structure material layer until the interlayer dielectric layer is exposed, thereby forming the conductive structure.

Another aspect of the present disclosure includes a semiconductor structure. The semiconductor structure includes a substrate, a defluorinated gate electrode layer on the substrate, and a barrier layer on a portion of a surface of the defluorinated gate electrode layer. The barrier layer is made of a material including titanium element. The semiconductor structure also includes a conductive structure on the barrier layer.

As disclosed, the technical solutions of the present disclosure have the following advantages.

In the method for forming semiconductor structures provided by the present disclosure, defluorination treatment is performed on the gate electrode layer, and after the defluorination treatment, a barrier layer is formed on a portion of the surface of the gate electrode layer. Accordingly, before the barrier layer is formed, the fluorine element content in the material of the gate electrode layer may be reduced by the defluorination treatment, such that the fluorine element that may react with the titanium element in the barrier layer may be reduced. As such, gaseous titanium fluoride formed between the gate electrode layer and the barrier layer may be reduced. Since the gaseous titanium fluoride formed between the gate electrode layer and the barrier layer may be reduced, voids between the gate electrode layer and the barrier layer, and voids between a conductive structure subsequently formed on the surface of the barrier layer and the gate electrode layer may be reduced. As a result, contact resistance between the conductive structure and the gate electrode layer may be reduced, and thus performance of the semiconductor structure may be improved.

Further, since the process of the defluorination treatment includes an annealing process, the gas used in the annealing process includes at least one of hydrogen and nitrogen, and the temperature of the annealing process is in a range approximately from 150° C. to 1100° C., the defluorination treatment may thus be achieved. Specifically, through the annealing process at a temperature above 150° C., the hydrogen gas or nitrogen gas may react with the fluorine element on the surface of the gate electrode layer, forming hydrogen fluoride gas or nitrogen fluoride gas. Accordingly, an amount of the fluorine element on the surface the gate electrode layer may be reduced. Meanwhile, the fluorine in the material of the gate electrode layer may be affected by the temperature of the annealing process. The fluorine may diffuse from a place with higher concentration to the surface of the gate electrode layer with lower concentration, and continue to react with hydrogen or nitrogen to form hydrogen fluoride gas or nitrogen fluoride gas. Thus, the fluorine element diffused to the surface of the gate electrode layer may continue to be reduced. As such, the fluorine element content in the gate electrode layer may be reduced.

Further, since the process of the defluorination treatment may include a plasma treatment process, and the ions used in the plasma treatment process may include at least one of hydrogen ions and boron ions, the defluorination treatment may be realized. Specifically, through the plasma process, hydrogen ions or boron ions capable of reacting with the fluorine element may be bombarded into the gate electrode layer, such that the hydrogen ions or boron ions and the fluorine element in the gate electrode layer may form hydrogen fluoride gas or boron fluoride gas. Accordingly, the fluorine element content in the gate electrode layer may be reduced.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that, in the present disclosure, the terms "surface" and "upper" are used to describe relative positional relationships in space, and are not limited to as direct contact.

Performance of a semiconductor structure formed by existing technologies may need to be improved.

Figure 1:
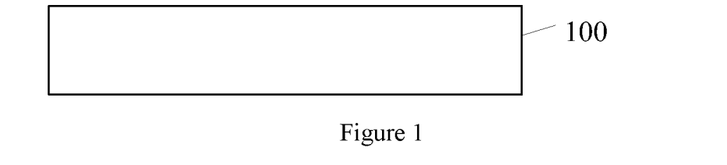
FIGS. 1 to 3 illustrate structural schematics corresponding to certain stages of a process of forming a semiconductor structure.
Figure 2:
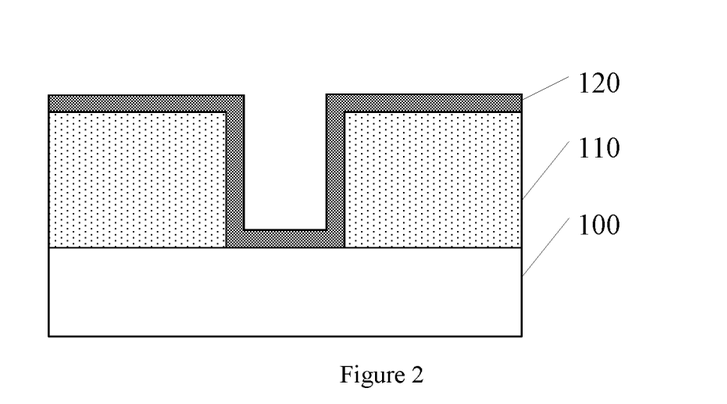
Figure 3:
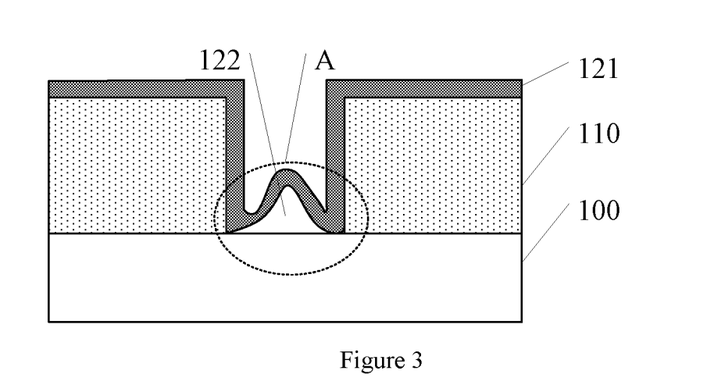

FIGS. 1 to 3 illustrate structural schematics corresponding to certain stages of a process of forming a semiconductor structure.

Referring to FIG. 1, a substrate (not shown) is provided, and a gate structure is formed on the substrate. The gate structure includes a gate electrode layer 100, and the gate electrode layer 100 is made of a material including tungsten.

Referring to FIG. 2, an interlayer dielectric layer 110 is formed on a surface of the gate structure. An opening is formed in the interlayer dielectric layer 110. The opening exposes a portion of a top surface of the gate electrode layer 100. A barrier material layer 120 is deposited on an inner wall surface of the opening and a surface of the interlayer dielectric layer 110. The barrier material layer 120 may be made of a material including titanium and titanium nitride.

The barrier material layer 120 may be used to provide material for subsequently forming a barrier layer 121 (as shown in FIG. 3) on the inner wall surface of the opening. Since titanium and titanium nitride have good compactness, the barrier layer 121 formed may have good compactness. Accordingly, after a conductive structure electrically connected to the gate electrode layer 100 is formed in the opening, the barrier layer 121 may reduce diffusion of elements of the conductive structure material in subsequent high-temperature processes. As such, influence of high-temperature processes on electrical properties of the semiconductor structure may be reduced.

However, in the above forming process, a chemical vapor deposition process may be used to form a material of the gate electrode layer 100, and a gas source used in the chemical vapor deposition process may include tungsten fluoride. Accordingly, the material of the gate electrode layer 100 may include fluorine element. In addition, in some subsequent high-temperature processes, such as high-temperature processing for forming metal silicides, the fluorine element in the material of the gate electrode layer 100 may diffuse due to influence of high-temperature environment in the high-temperature processes. Accordingly, under the high temperature environment, the fluorine element diffused to the surface of the gate electrode layer 100 may react with the titanium element in the material of the barrier layer 121, forming gaseous titanium fluoride. As a result, a void 122 may be formed between the gate electrode layer 100 and the barrier layer 121 (as shown in area A in FIG. 3), or the barrier layer 121 may be broken, resulting in relatively large contact resistance between the gate electrode layer 100 and the conductive structure. Accordingly, the semiconductor structure may have poor performance.

The present disclosure provides a method for forming semiconductor structures. The method includes providing a substrate, forming a gate electrode layer on the substrate, and performing defluorination treatment on the gate electrode layer. The forming method also includes, after the defluorination treatment, forming a barrier layer on a portion of a surface of the gate electrode layer. The barrier layer may be made of a material including titanium element. Accordingly, through the defluorination treatment, performance of the semiconductor structure may be improved.

As disclosed, before forming the barrier layer, the gate electrode layer may be defluorinated, and thus performance of the semiconductor structure may be improved.

Figure 7:
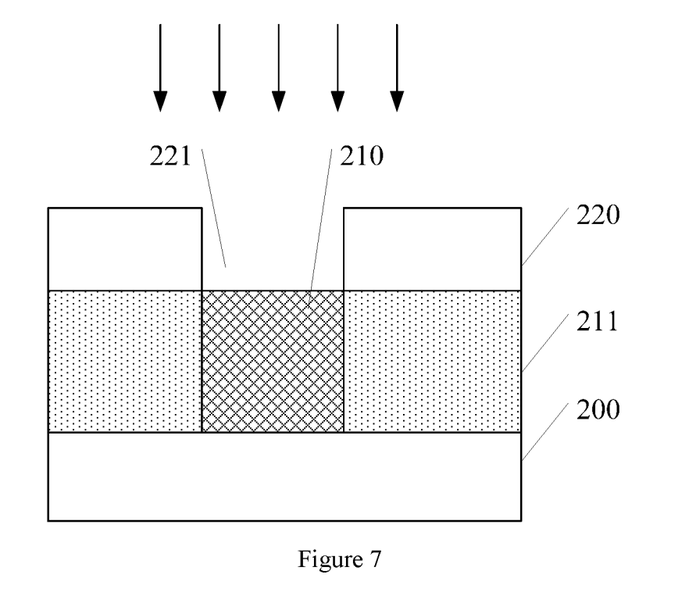
Figure 8:
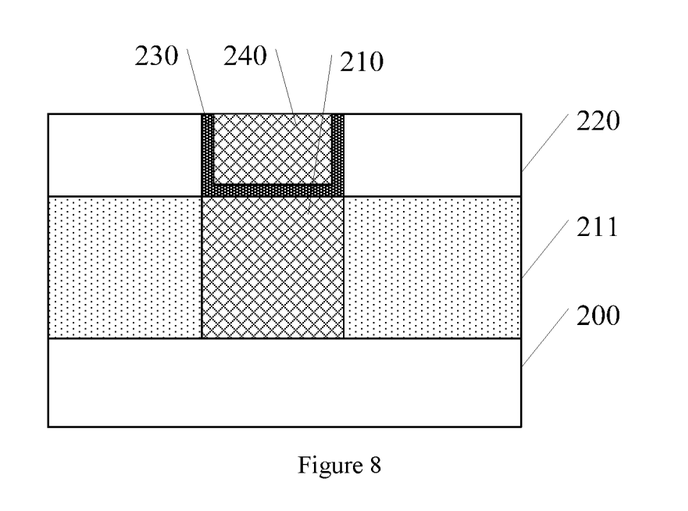
Figure 9:
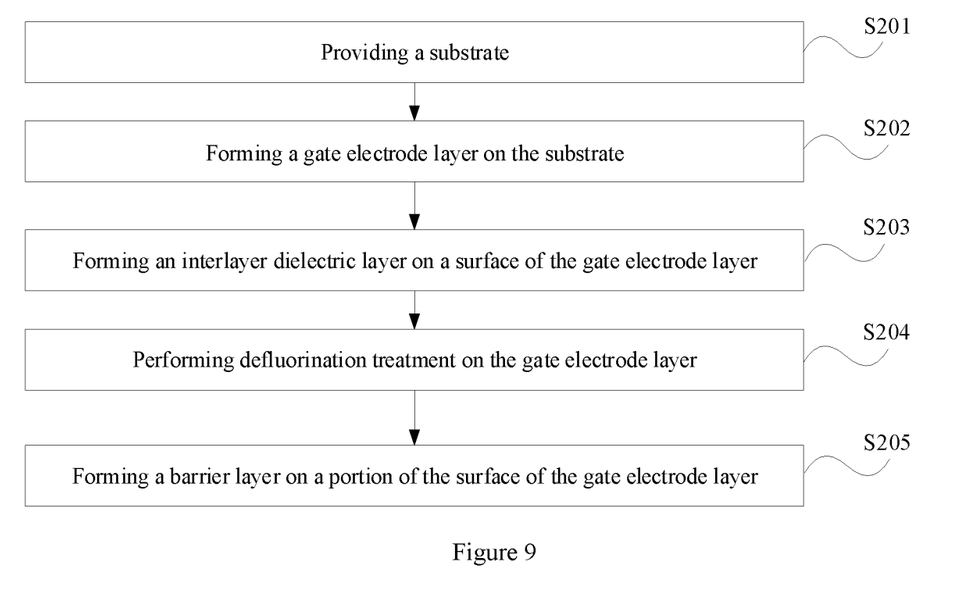
FIG. 9 illustrates a flowchart of an exemplary forming method of a semiconductor structure, consistent with the disclosed embodiments of the present disclosure.

FIG. 9 illustrates a flowchart of an exemplary forming method of a semiconductor structure, consistent with the disclosed embodiments of the present disclosure. FIGS. 4 to 8 illustrate structural schematics corresponding to certain stages of the exemplary forming method.

Figure 4:
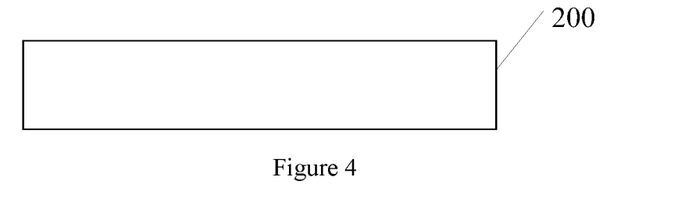
FIGS. 4 to 8 illustrate structural schematics corresponding to certain stages of an exemplary forming method of a semiconductor structure, consistent with the disclosed embodiments of the present disclosure.

As shown in FIG. 9, at the beginning of the forming method, a substrate is provided (S201). FIG. 4 illustrates a corresponding semiconductor structure.

Referring to FIG. 4, a substrate 200 is provided. In one embodiment, the substrate 200 includes a base (not shown) and a plurality of fin structures (not shown) on the base. In some other embodiments, the base may be a planar substrate.

The substrate 200 is made of a material including a semiconductor material. In one embodiment, the substrate 200 is made of silicon. In some other embodiments, the substrate may be made of silicon carbide, silicon germanium, multi-element semiconductor material including group III-V elements, silicon-on-insulator (SOI), germanium-on-insulator (GOI), or the like. The multi-element semiconductor material including the group III-V elements may include InP, GaAs, GaP, InAs, InSb, InGaAs or InGaAsP.

Figure 5:
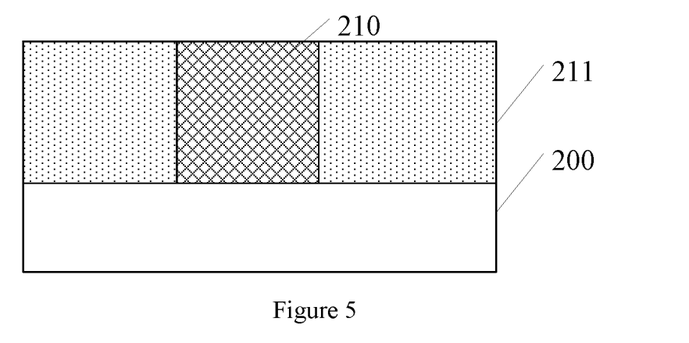

Returning to FIG. 9, after providing the substrate, a gate electrode layer may be formed on the substrate (S202). FIG. 5 illustrates a corresponding semiconductor structure.

Referring to FIG. 5, a gate electrode layer 210 is formed on the substrate 200. In one embodiment, when forming the gate electrode layer 210, a gate dielectric layer (not shown) and a work function layer (not shown) may be formed. The work function layer is located on a surface of the gate dielectric layer, and the gate electrode layer 210 is located on a surface of the work function layer.

The gate electrode layer 210, the gate dielectric layer and the work function layer may constitute a gate structure (not shown). The gate structure spans a fin structure of the plurality of fin structures, and the gate electrode layer 210 also spans the fin structure.

The gate electrode layer 210 is made of a material including a metal material. In one embodiment, the gate electrode layer 210 is made of a material including tungsten.

In one embodiment, the gate dielectric layer is made of a material including a high dielectric constant material (with a dielectric constant greater than approximately 3.9). The high dielectric constant material may include one or a combination of hafnium dioxide, hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide or aluminum oxide, etc.

In one embodiment, the work function layer is made of a material including one or a combination of titanium nitride, tantalum nitride, or titanium aluminum.

In one embodiment, a method of forming the gate structure includes forming a plurality of dummy gate structures (not shown) across the fin structure on the substrate, and a gate sidewall spacer (not shown) on a sidewall of a dummy gate structure of the plurality of dummy gate structures. The method also includes, after forming the dummy gate structure, forming a first dielectric material layer (not shown) covering a sidewall surface of the dummy gate structure on the surface of the substrate, and planarizing the first dielectric material layer until a top surface of the dummy gate structure is exposed, thereby forming a first dielectric layer 211. The method also includes, after forming the first dielectric layer 211, removing the dummy gate structure, thereby forming a gate opening (not shown) in the first dielectric layer 211. The method also includes, forming a gate structure material layer in the gate opening and on the surface of the first dielectric layer 211. The method also includes planarizing the gate structure material layer until the surface of the first dielectric layer 211 is exposed, thereby forming the gate structure in the gate opening.

In one embodiment, the gate structure material layer includes a gate dielectric material layer (not shown) on the surface of the first dielectric layer 211 and the inner wall surface of the gate opening, a work function material layer (not shown) on a surface of the gate dielectric material layer, and a gate electrode material layer (not shown) on a surface of the work function material layer. The gate electrode material layer fills the gate opening.

The gate dielectric material layer may provide a material for forming the gate dielectric layer, the work function material layer provides a material for forming the work function layer, and the gate electrode material layer provides a material for forming the gate electrode layer 210.

In one embodiment, a process of forming the gate electrode material layer includes a chemical vapor deposition process, and a gas source used in the chemical vapor deposition process may include tungsten fluoride. Accordingly, the gate electrode layer 210 formed may include tungsten. In addition, since the gas source used may include tungsten fluoride, the gate electrode layer 210 formed may contain fluorine.

In one embodiment, a process of forming the gate dielectric material layer may include an oxidation process, a deposition process, or the like. The deposition process may include, for example, a chemical vapor deposition process, a physical vapor deposition process, or an atomic layer deposition process.

In one embodiment, a process of forming the work function material layer may include a deposition process. The deposition process may include, for example, a chemical vapor deposition process, a physical vapor deposition process, or an atomic layer deposition process.

In one embodiment, a process of planarizing the gate structure material layer may include an etch-back process or a chemical mechanical polishing process.

In one embodiment, the first dielectric layer 211 is made of a material including silicon oxide.

In one embodiment, the gate sidewall spacer is made of a material including a low-k dielectric material (with k less than approximately 3.9).

In one embodiment, a method for forming the dummy gate structure includes forming a dummy gate material film (not shown) covering a surface of the fin structure on the substrate. The method also includes patterning the dummy gate material film until the surface of the substrate is exposed, thereby forming a dummy gate structure across the fin structure on the substrate. A top surface of the dummy gate structure is higher than a top surface of the fin structure.

In one embodiment, the method for forming semiconductor structures also includes, before forming the dummy gate structure, forming a base dielectric layer (not shown) on the surface of the substrate 200. The base dielectric layer is also located on a portion of the sidewall surface of the fin structure. The method also includes, after forming the dummy gate structure and the gate sidewall spacer, and before forming the first dielectric layer 211, forming a source/drain doped layer (not shown) in the fin structure at two sides of the dummy gate structure.

In one embodiment, a method for forming the source/drain doped layer includes forming a source/drain opening (not shown) in the fin structure at two sides of the dummy gate structure, and using an epitaxial process to form the source/drain doped layers in the source/drain opening.

Figure 6:
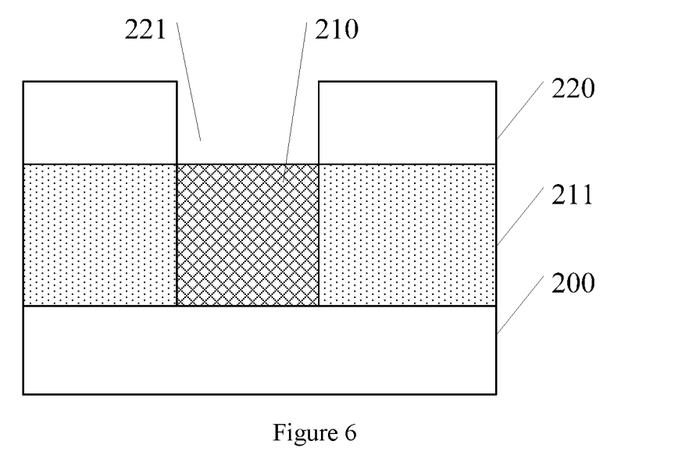

Returning to FIG. 9, after forming the gate electrode layer, an interlayer dielectric layer may be formed on the surface of the gate electrode layer (S203). FIG. 6 illustrates a corresponding semiconductor structure.

Referring to FIG. 6, after forming the gate electrode layer 210 and before a defluorination treatment, an interlayer dielectric layer 220 is formed on the surface of the gate electrode layer 210. The interlayer dielectric layer 220 includes a contact opening 221 therein, and the contact opening 221 exposes a top surface of the gate electrode layer 210. The contact opening 221 provides space for subsequent formation of a barrier layer and a conductive structure.

In one embodiment, a method of forming the interlayer dielectric layer 220 includes forming an interlayer dielectric material layer (not shown) on the surface of the first dielectric layer 211 and the surface of the gate electrode layer 210. The method also includes forming a contact opening mask layer on a surface of the interlayer dielectric material layer, the contact opening mask layer exposing the surface of the interlayer dielectric material layer on the gate electrode layer 210. The method also includes, using the contact opening mask layer as a mask, etching the interlayer dielectric material layer until a top surface of the gate electrode layer 210 is exposed, thereby forming the interlayer dielectric layer 220.

In one embodiment, a process of forming the interlayer dielectric material layer includes a spin coating process or a deposition process. The deposition process may include, for example, a chemical vapor deposition process, a physical vapor deposition process, or an atomic layer deposition process.

In one embodiment, a process of etching the interlayer dielectric material layer may include a dry etching process or a wet etching process.

In one embodiment, the interlayer dielectric layer 220 is made of a material including silicon oxide. In some other embodiments, the interlayer dielectric layer 220 may be made of a material including silicon nitride.

In one embodiment, after the interlayer dielectric layer 220 is formed, the contact opening mask layer is removed.

Returning to FIG. 9, after forming the interlayer dielectric layer, defluorination treatment may be performed on the gate electrode layer (S204). FIG. 7 illustrates a corresponding semiconductor structure.

Referring to FIG. 7, defluorination treatment may be performed on the gate electrode layer 210.

In one embodiment, a process of the defluorination treatment includes an annealing process. A gas used in the annealing process includes at least one of hydrogen and nitrogen, and a temperature of the annealing process is in a range approximately from 150° C. to 1100° C.

Since the process of the defluorination treatment includes an annealing process, the gas used in the annealing process includes at least one of hydrogen and nitrogen, and the temperature of the annealing process is in a range approximately from 150° C. to 1100° C., the defluorination treatment may thus be achieved. Specifically, through the annealing process at a temperature above 150° C., the hydrogen gas or nitrogen gas may react with the fluorine element on the surface of the gate electrode layer 210, forming hydrogen fluoride gas or nitrogen fluoride gas. Accordingly, an amount of the fluorine element on the surface the gate electrode layer 210 may be reduced. Meanwhile, the fluorine in the material of the gate electrode layer 210 may be affected by the temperature of the annealing process. The fluorine may diffuse from a place with higher concentration to the surface of the gate electrode layer 210 with lower concentration, and continue to react with hydrogen or nitrogen to form hydrogen fluoride gas or nitrogen fluoride gas. Thus, the fluorine element diffused to the surface of the gate electrode layer 210 may continue to be reduced. As such, the fluorine element content in the gate electrode layer 210 may be reduced.

A preferable temperature range of the annealing process may be approximately from 450° C. to 800° C. Specifically, when the temperature of the annealing process is too low (lower than approximately 450° C.), reaction speed may be reduced, resulting in poor efficiency of the defluorination treatment. When the temperature of the annealing process is too high (higher than approximately 800° C.), the temperature may change material properties of the gate structure, and electrical properties of the semiconductor device may thus be affected.

In one embodiment, the reaction time of the annealing process is in a range approximately from 2 hours to 8 hours.

In one embodiment, the gas pressure of the defluorination treatment is in a range approximately from 1 mTorr to 100 mTorr.

In another embodiment, the process of the defluorination treatment may include a plasma treatment process. Ions used in the plasma treatment process may include at least one of hydrogen ions and boron ions.

Specifically, since the process of the defluorination treatment may include a plasma treatment process, and the ions used in the plasma treatment process may include at least one of hydrogen ions and boron ions, the defluorination treatment may be realized. Specifically, through the plasma process, hydrogen ions or boron ions capable of reacting with the fluorine element may be bombarded into the gate electrode layer, such that the hydrogen ions or boron ions and the fluorine element in the gate electrode layer may form hydrogen fluoride gas or boron fluoride gas. Accordingly, the fluorine element content in the gate electrode layer may be reduced.

In another embodiment, a temperature of the plasma treatment process is in a range approximately from 35 degrees Celsius to 65 degrees Celsius.

In another embodiment, the defluorination treatment includes each of the annealing process and the plasma treatment process. It should be noted that a process sequence between the annealing process and the plasma treatment process may not affect defluorination effects.

In some other embodiments, after the defluorination treatment, the interlayer dielectric layer may be formed on the surface of the gate electrode layer. The interlayer dielectric layer includes a contact opening, and the contact opening exposes the top surface of the gate electrode layer.

Returning to FIG. 9, after performing the defluorination treatment, a barrier layer may be formed on a portion of the surface of the gate electrode layer (S205). FIG. 8 illustrates a corresponding semiconductor structure.

Referring to FIG. 8, after the defluorination treatment, a barrier layer 230 is formed on a portion of the surface of the gate electrode layer 210. The barrier layer 230 is made of a material including titanium element.

In the present disclosure, defluorination treatment is performed on the gate electrode layer 210, and after the defluorination treatment, a barrier layer 230 is formed on a portion of the surface of the gate electrode layer 210. Accordingly, before the barrier layer 230 is formed, the fluorine element content in the material of the gate electrode layer 210 may be reduced by the defluorination treatment, such that the fluorine element that may react with the titanium element in the barrier layer 230 may be reduced. As such, gaseous titanium fluoride formed between the gate electrode layer 210 and the barrier layer 230 may be reduced. Since the gaseous titanium fluoride formed between the gate electrode layer 210 and the barrier layer 230 may be reduced, voids between the gate electrode layer 210 and the barrier layer, and voids between a conductive structure 240 subsequently formed on the surface of the barrier layer and the gate electrode layer 210 may be reduced. As a result, contact resistance between the conductive structure 240 and the gate electrode layer 210 may be reduced, and thus performance of the semiconductor structure may be improved.

Specifically, a method of forming the barrier layer 230 includes, after the defluorination treatment, forming a barrier material film (not shown) in the contact opening 221 and on the surface of the interlayer dielectric layer 220, and planarizing the barrier material film until the interlayer dielectric layer 220 is exposed, thereby forming the barrier layer 230 in the contact opening 221.

In one embodiment, a process of forming the barrier material film includes a chemical vapor deposition process, a physical vapor deposition process, or an atomic layer deposition process.

In one embodiment, a process of planarizing the barrier material film includes a chemical mechanical polishing process or an etch-back process.

In one embodiment, the method for forming semiconductor structures further includes forming a conductive structure 240 in the process of forming the barrier layer 230. The conductive structure 240 is located on a surface of the barrier layer 230, and the conductive structure 240 fills the contact opening 221.

Specifically, a method of forming the conductive structure 240 includes, after forming the barrier material film, forming a conductive structure material layer (not shown) on a surface of the barrier material film. The method also includes, before or simultaneously with planarizing the barrier material film, planarizing the conductive structure material layer until the interlayer dielectric layer 220 is exposed, thereby forming the conductive structure 240 on the surface of the barrier layer 230 in the contact opening 221.

In one embodiment, a process of forming the barrier material film includes one of a metal electroplating process, a metal electroless plating process, and a deposition process. The deposition process may be, for example, a chemical vapor deposition process, a physical vapor deposition process, or an atomic layer deposition process.

In one embodiment, the barrier layer 230 is made of a material including at least one of titanium and titanium nitride. Since titanium and titanium nitride have good compactness, the barrier layer 230 formed may have good compactness. Accordingly, due to barrier effects of the barrier layer 230, diffusion of elements in the material of the conductive structure 240 may be reduced in some subsequent high-temperature processes. As such, influence of the high-temperature processes on electrical performance of the semiconductor structure may be reduced.

In one embodiment, the method for forming semiconductor structures also includes, after the defluorination treatment, forming a contact layer (not shown) on a surface of the fin structure on two sides of the gate electrode layer 210. Accordingly, through the contact layer, contact resistance between a source/drain conductive structure formed subsequently and the source/drain structure may be reduced, and performance of the semiconductor structure may thus be improved.

In one embodiment, the contact layer is made of a material including metal silicide. The metal silicide may include titanium silicide or nickel silicide.

Specifically, a method of forming the contact layer includes, simultaneously with or after forming the interlayer dielectric layer 220, forming a source/drain contact opening in the interlayer dielectric layer 220. The source/drain contact opening exposes the surface of the source/drain structure in the fin structure on two sides of the gate electrode layer 210. The method also includes, after forming the barrier material film and before forming the conductive structure material layer, forming the contact layer on the surface of the source/drain structure at a bottom of the source/drain contact opening.

In one embodiment, the conductive structure material layer is also located on a surface of the contact layer in the source/drain contact opening, and the conductive structure material layer also fills the source/drain contact opening. Thus, simultaneously with planarizing the conductive structure material layer to form the conductive structure 240, a source/drain conductive structure may be formed on the surface of the contact layer in the fin structure on two sides of the gate electrode layer 210. The source/drain conductive structure may be used for electrical connection with the source/drain structure.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method for forming a semiconductor structure, comprising:
   providing a substrate;
   forming a gate electrode layer on the substrate;
   forming an interlayer dielectric layer on top surfaces of the gate electrode layer and the substrate;
   forming a contact opening in the interlayer dielectric layer to expose the top surface of the gate electrode layer;
   performing a defluorination treatment on the gate electrode layer; and
   after performing the defluorination treatment, forming a barrier material film in the contact opening and on a top surface of the interlayer dielectric layer, and planarizing the barrier material film until the top surface of the interlayer dielectric layer is exposed, to form a barrier layer in the contact opening and on the top surface of the gate electrode layer, wherein the barrier layer is made of a material including titanium element, and a top surface of the barrier layer is coplanar with the top surface of the interlayer dielectric layer.

2. The method according to claim 1, wherein:
   a process of the defluorination treatment includes an annealing process, wherein:
   a gas used in the annealing process includes at least one of hydrogen gas and nitrogen gas; and
   a temperature of the annealing process is in a range approximately from 150° C. to 1100° C.

3. The method according to claim 2, wherein:
   the temperature of the annealing process is in a range approximately from 450° C. to 800° C.

4. The method according to claim 2, wherein:
   time of the annealing process is in a range approximately from 2 hours to 8 hours.

5. The method according to claim 1, wherein:
   the process of the defluorination treatment includes a plasma treatment process, wherein:
   ions used in the plasma treatment process include at least one of hydrogen ions and boron ions.

6. The method according to claim 5, wherein:
   a temperature of the plasma treatment process is in a range approximately from 35° C. to 65° C.

7. The method according to claim 1, wherein:
   the barrier layer is made of a material including at least one of titanium and titanium nitride.

8. The method according to claim 1, wherein:
   gas pressure of the defluorination treatment is in a range approximately from 1 mTorr to 100 mTorr.

9. The method according to claim 1, wherein:
   the gate electrode layer is made of a material including tungsten; and
   a process of forming the gate electrode material layer includes a chemical vapor deposition process, wherein a gas source used in the chemical vapor deposition process includes tungsten fluoride.

10. The method according to claim 1, wherein the interlayer dielectric layer and the contact opening are formed after forming the gate electrode layer and before performing the defluorination treatment.

11. The method according to claim 1, wherein the interlayer dielectric layer and the contact opening are formed after performing the defluorination treatment.

12. The method according to claim 1, further comprising:
    forming a conductive structure in the process of forming the barrier layer, wherein:
    the conductive structure is on a surface of the barrier layer; and
    the conductive structure fills the contact opening.

13. The method according to claim 1, wherein:
    the substrate includes a base and a plurality of fin structures on the base; and
    the gate structure spans a fin structure of the plurality of fin structures.

14. The method according to claim 13, after performing the defluorination treatment and before forming the conductive structure, further comprising:
    forming a contact layer on a surface of the fin structure on two sides of the gate electrode layer.

15. The method according to claim 14, wherein:
    the contact layer is made of a material including metal silicide.

16. The method according to claim 5, wherein:
    the process of the defluorination treatment also include an annealing process.

17. The method according to claim 1, wherein:
    a process of forming the barrier material film includes a chemical vapor deposition process, a physical vapor deposition process, or an atomic layer deposition process; and
    a process of planarizing the barrier material film includes a chemical mechanical polishing process or an etchback process.

18. The method according to claim 12, wherein a process of forming the conductive structure includes:
    after forming the barrier material film, forming a conductive structure material layer on a surface of the barrier material film; and
    before or when planarizing the barrier material film, planarizing the conductive structure material layer until the interlayer dielectric layer is exposed, thereby forming the conductive structure.

19. The method according to claim 1, further comprising:
    forming a conductive structure on the top surface and sidewall surfaces of the barrier layer, wherein the conductive structure fills the contact opening, and a top surface of the conductive structure is coplanar with the top surface of the interlayer dielectric layer.

* * * * *